(12) United States Patent
Claprood

(10) Patent No.: US 6,515,854 B1
(45) Date of Patent: Feb. 4, 2003

(54) DISK DRIVE ASSEMBLY WITH PRESS FIT LEVER

(75) Inventor: Edward Claprood, Southborough, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/628,968

(22) Filed: Jul. 31, 2000

(51) Int. Cl.⁷ .................................................. G01F 1/16
(52) U.S. Cl. ........................ 361/685; 361/801; 312/331; 439/157
(58) Field of Search ............................... 361/685, 683, 361/684, 686, 724–727, 732, 740, 754–755, 759, 798, 801; 312/223.2, 244, 331–331.1, 334.23; 439/60, 152–153, 157, 327, 328, 331, 345, 304, 928.1

(56) References Cited

U.S. PATENT DOCUMENTS

| | | | |
|---|---|---|---|
| 6,233,143 B1 * | 5/2001 | Gamble et al. ............. | 361/685 |
| 6,272,010 B1 * | 8/2001 | Schmitt ...................... | 361/685 |
| 6,282,099 B1 * | 8/2001 | Wilson et al. .............. | 361/753 |

* cited by examiner

*Primary Examiner*—Darren Schuberg
*Assistant Examiner*—Hung Van Duong
(74) *Attorney, Agent, or Firm*—Chapin & Huang, L.L.C.; David E. Huang, Esq.

(57) ABSTRACT

The invention is directed to techniques which use a press fit lever for a disk drive assembly. Such a press fit lever alleviates the need for additional hardware (e.g., screws and inserts) thus reducing complexity, costs and time associated with installing levers on disk drive assemblies. One arrangement is directed to a data storage system having a main assembly and a disk drive assembly. The main assembly includes a supporting structure and a connector fastened to the supporting structure. The disk drive assembly includes a disk drive assembly having a housing, a disk drive attached to the housing, and a lever that installs the housing into and removes the housing from the main assembly to enable the disk drive to respectively connect to and disconnect from the connector of the main assembly. The lever includes a frame portion, and side portions that extend from the frame portion. The side portions pivotably couple the lever to the housing in a press fit manner such that the frame portion is capable of pivoting relative to the housing and the main assembly in order to secure the housing to and release the housing from the main assembly. In this arrangement, there is no need for screws or inserts to couple the lever to the housing.

19 Claims, 10 Drawing Sheets

DISK DRIVE ASSEMBLY WITH PRESS FIT LEVER

BACKGROUND OF THE INVENTION

A typical computer system includes a data storage system (or subsystem) having one or more disk drives. Some data storage systems allow a user to install or remove a disk drive in a relatively quick manner without handling any cables or screws. FIG. 1 shows a conventional data storage system 20 having relatively quick disk drive installation and removal capabilities. The data storage system 20 includes a disk drive assembly 22 and a main assembly 24. The disk drive assembly 22 has a sheet metal housing 26, a disk drive 28, a daughter card 30 and a lever 32. The main assembly 24 has a sheet metal support structure 34 that defines (i) an opening 36 through which the disk drive assembly 22 enters and exits, and (ii) a back end 38. The main assembly 24 further includes a connector 40 which mounts to the back end 38 of the support structure 34, and a post 44 (e.g., a metallic bar) that fastens to a side or edge of the opening 36 of the support structure 34.

A user can install the disk drive assembly 22 into the main assembly 24, or remove the disk drive assembly 22 from the main assembly 24, by operating the lever 32 and sliding the disk drive assembly housing 26 through the opening 36 of the main assembly support structure 34. The housing 26 includes guides 46, 48 which facilitate motion of the housing 26 within the support structure 34. In particular, the guides 46 align with corresponding guides within the support structure 34 (corresponding guides not shown) to properly align the disk drive assembly 22 within the support structure 34. Furthermore, the guide 48 (and guides 46 to some extent) reduces friction between surfaces of the disk drive assembly housing 26 and the support structure 34.

When the disk drive assembly 22 is properly installed within the main assembly 24, a connecting portion 50 of the daughter card 30 mates with the slot 42 of the connector 40. Contacts along the connecting portion 50 make electrical contact with corresponding contacts within the connector 40. In this mated position, the disk drive assembly 22 is capable of receiving power and communicating with other devices (e.g., a processor) through the connector 40 in order to perform data storage and retrieval operations. The daughter card 30 operates as an interface between the other devices and the disk drive 28.

Further details of the lever 32 and how the lever 32 operates with the disk drive assembly 22 will now be provided with reference to FIGS. 1 and 2. The lever 32 includes sides 52 having large fingers 54. The large fingers 54 define grooves 56 with a lower edge 58 of the lever 32. The lever 32 further includes a latch 60 which latches to the housing 26 through a housing hole 70 (FIG. 2) in order to secure the lever 32 in an upright position, and a cavity 62 (FIG. 1) for supporting a light emitting diode (LED) assembly (not shown) to provide operation information to the user when the disk drive assembly 22 is installed and in operation. The lever sides 52 define holes 64 through which hardware pivotably fastens the lever 32 to the housing 26 thus enabling the lever 32 to rotate around a pivot axis 66. In particular, as shown in FIG. 2, metal screws 72 pass through the holes 64 of the lever 32 and corresponding holes in the housing 26, and thread into metal inserts 74 disposed on the interior of the housing 26.

During the disk drive assembly manufacturing process, a user or automated machinery typically installs the screws 72 and inserts 74. In particular, for each side 52, the user or machinery places an insert 74 on the inner side of the housing 26, and passes a screw 72 through a corresponding hole 64 of the lever 32 and through an outer side of the housing 26. The user or machinery then threads that screw 72 into the insert 74 to pivotably secure the lever 32 to the housing 26. Typically, the user or machinery adds the disk drive 28 and the daughter card 30 to the housing 26 in subsequent manufacturing steps.

To install the disk drive assembly 22 into the main assembly 24, the user initially positions the lever 32 away from the housing 26 as shown in FIG. 2. The user then slides the disk drive assembly 22 into the main assembly support structure 34 until the post 44 fits within the groove 56 on each side 52 of the lever 32. The user then pushes on the lever 32 such that the lever 32 rotates about the pivot axis 66 toward the housing 26. As the user pushes on the lever 32, the large fingers 54 of the lever 32 grab the post 44 thus enabling the lever 32 to provide leverage to move the housing 26 further into the support structure 34. Such movement causes the connecting portion 50 of the daughter card 30 to properly mate with the connector 40 in a controlled and consistent manner. The user typically pushes the lever 32 until the lever is completely upright and so that the latch 60 latches into the opening 70 of the housing 26 to secure the lever 32 in the upright position.

To remove the disk drive assembly 22 from the main assembly 24, the user squeezes the latch 60 to release the latch 60 from the housing 26, and pulls the lever 32 away from the housing 26. The lever 32 pivots away from the housing 26, and the edge 58 of the lever 32 pushes against the post 44 to provide leverage that moves the disk drive assembly 22 away from the back end 38 of the support structure 34 in a controlled and consistent manner. Accordingly, the portion 50 of the daughter card 30 disconnects from the slot 42 of the connector 40, and the disk drive assembly 22 slides out of the main assembly 24. The user then lifts the disk drive assembly 22 away from the main assembly 24 to complete the removal process.

SUMMARY OF THE INVENTION

Unfortunately, there are drawbacks associated with a conventional disk drive assembly which uses metal screws and metal inserts to pivotably mount a lever to a disk drive assembly housing. For example, with reference to FIGS. 1 and 2, the screws 72 and the inserts 74 are separate hardware that is dis-contiguous with the lever 32 itself. Accordingly, there is an additional cost associated with the screws 72 and the inserts 74, and an additional time requirement for a user or machinery to install the screws 72 and the inserts 74 in order to pivotably secure the lever 32 to the housing 26. Additionally, there is time and costs associated with training the user or configuring the machinery to properly install the screws 72 and the inserts 74. Furthermore, there is a likelihood that the screws 72 and the inserts 74 will disassemble from the lever 32 causing other problems, e.g., a detached lever 32, a disk drive assembly 22 stuck within a main assembly 24, etc.

In contrast, the invention is directed to techniques which use a press fit lever for a disk drive assembly. Such a press fit lever alleviates the need for additional hardware (e.g., screws and inserts) thus reducing complexity, costs and time associated with installing levers on disk drive assemblies. Furthermore, since there are no screws or inserts required, there can be fewer parts (e.g., no parts) holding the lever in place that could disassemble.

One arrangement is directed to a data storage system having a main assembly and a disk drive assembly. The main assembly includes a supporting structure and a connector fastened to the supporting structure. The disk drive assembly includes a disk drive assembly having a housing, a disk drive attached to the housing, and a lever that installs the housing into and removes the housing from the main assembly to enable the disk drive to respectively connect to and disconnect the connector of the main assembly. The lever includes a frame portion, and side portions that extend from the frame portion. The side portions pivotably couple the lever to the housing in a press fit manner such that the frame portion is capable of pivoting relative to the housing and the main assembly in order to secure the housing to and release the housing from the main assembly. In this arrangement, there is no need for screws or inserts to couple the lever to the housing.

In one arrangement, manufacturing a disk drive assembly for installation within a main assembly involves providing a disk drive, a housing that couples with the main assembly, and a lever. This arrangement further involves attaching the disk drive to the housing; and press fitting the lever onto the housing to pivotably couple the lever to the housing in a press fit manner such that the lever is capable of pivoting relative to the housing around a pivot axis. Accordingly, in this arrangement, there is no need for a user or automated machinery to install any screws or inserts to secure the lever to the housing.

In one arrangement, the housing defines cavities, and the side portions of the lever include stubs that insert into the defined cavities in order to pivotably couple the lever to the housing. Preferably, each side portion includes a finger that defines, with the frame portion, a groove that engages with the main assembly; and each finger has one of the stubs that insert into the cavities defined by the housing. In one arrangement, the frame portion and the side portions including the stubs form a single, contiguous member of the lever. Accordingly, there is no need for any screws or inserts. Rather, the lever can be formed as a single, contiguous member (e.g., molded using plastic injection) for lower manufacturing costs and simpler installation. In one arrangement, the use of complex, automated equipment is unnecessary. Rather, a user can simply snap the press fit lever in place manually. Accordingly, the invention provides a low cost, quick-to-assemble, ergonomically improved technique for manufacturing a disk drive assembly.

In one arrangement, the lever further includes a cantilever mechanism that extends from the frame portion, and forms a single, contiguous member with the frame portion and side portions including the stubs. Preferably, the cantilever mechanism includes multiple cantilever elements, each cantilever element extending from the frame portion. The cantilever mechanism enables the lever to provide enhanced leveraging to install the disk drive assembly within the main assembly in a consistent and controlled manner (e.g., to provide a proper amount of insertion force to mate a connection area of the disk drive assembly to a corresponding connection area of the main assembly).

In one arrangement, installation of the disk drive assembly in the main assembly involves partially inserting the disk drive assembly into the main assembly. Such installation further involves pivoting the lever of the disk drive assembly around a pivot axis, at which the lever is pivotably coupled to the housing in a press fit manner, in order to secure the disk drive assembly to the main assembly. Preferably, the lever includes a frame portion and side portions which define grooves with the frame portion. Here, pivoting the lever involves moving the lever such that the grooves engage with portions of the main assembly when securing the disk drive assembly to the main assembly. Accordingly, the lever can guide the disk drive assembly into the main assembly in a controller and consistent manner with an appropriate amount of insertion force gained by leverage action of the lever (i.e., the grooves) against the main assembly.

In one arrangement, removal a disk drive assembly from a main assembly involves pivoting the lever of the disk drive assembly around a pivot axis, at which the lever is pivotably coupled to the housing in a press fit manner, in order to release the disk drive assembly from the main assembly. Such removal further involves subsequently sliding the disk drive assembly out of the main assembly. In one arrangement, grooves defined by the lever disengage from portions of the main assembly when releasing the disk drive assembly from the main assembly thus enabling the disk drive assembly to exit the main assembly in a controlled and consistent manner.

The features of the invention, as described above, may be employed in data storage systems and other computer-related components such as those manufactured by EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques which use a press fit lever for a disk drive assembly. Use of the press fit lever alleviates the need for additional hardware (e.g., metal screws and inserts). Accordingly, the techniques of the invention are well-suited to reducing complexity, and lowering costs and time associated with installing levers on disk drive assemblies. The techniques of the invention may be employed in data storage systems, as well as other computer-related systems and devices, such as those manufactured by EMC Corporation of Hopkinton, Mass.

Figure 3:
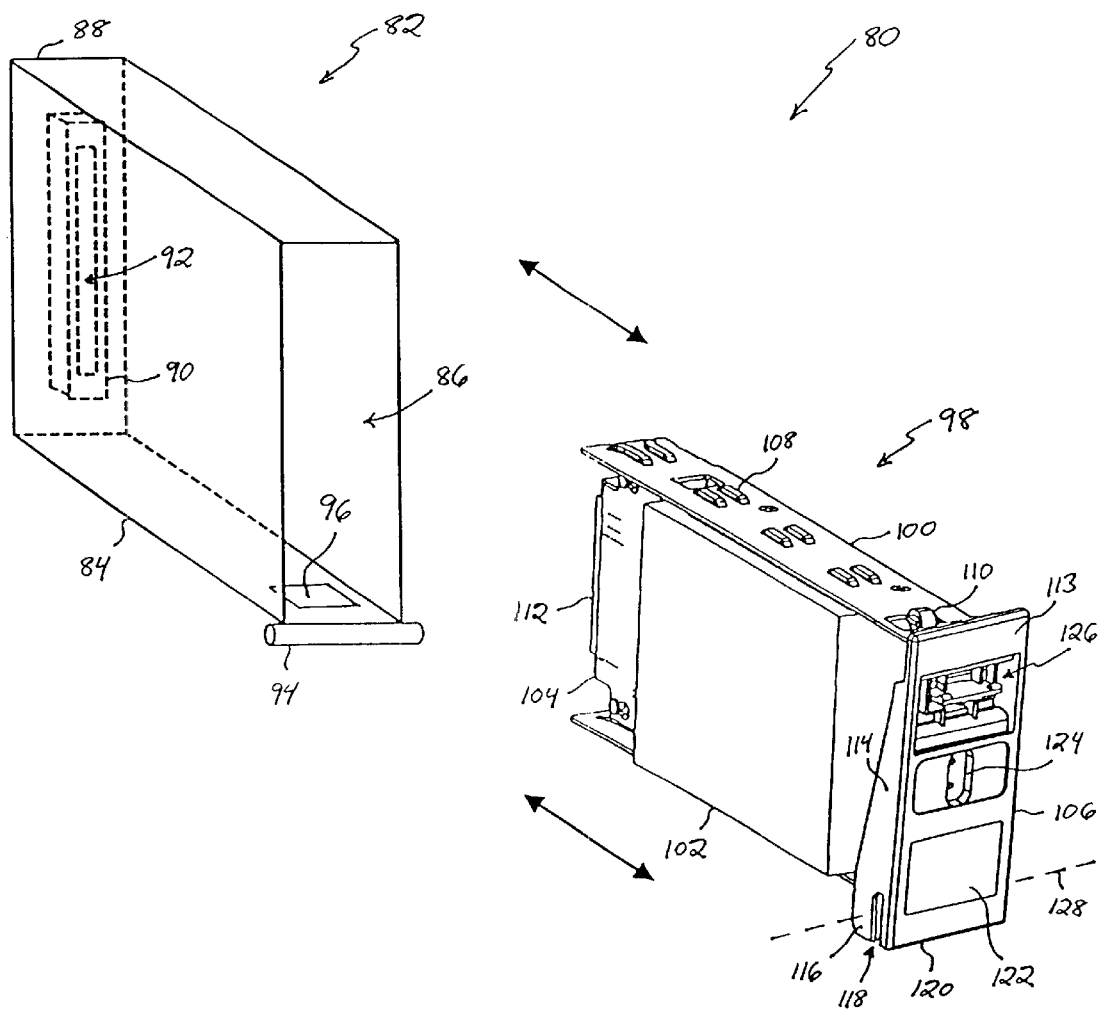
FIG. 3 shows a perspective view of a data storage system that includes a main assembly and a disk drive assembly having a press fit lever which is secured to a housing of the disk drive assembly in a press fit manner.

FIG. 3 shows a data storage system 80 which is suitable for use by the invention. The data storage system 80 includes a main assembly 82 and a disk drive assembly 98. The main assembly 82 is similar to the main assembly 24 of FIG. 1 in that the main assembly 82 includes a support structure 84 (e.g., a metallic housing) that defines (i) an opening 86 through which the disk drive assembly 98 enters and exits, and (ii) a back end 88. The main assembly 82 further includes, among other things, a connector 90 which (i) mounts to the back end 88 of the support structure 84 and (ii) has a slot 92 for connecting with the disk drive assembly 98. The main assembly 82 further includes a post 94 (e.g., a bar) which fastens to a side (or edge) of the support structure opening 86.

In contrast to the conventional main assembly 24 (FIG. 1), the support structure 84 of the main assembly 82 (FIG. 3) defines an opening 96. As will be discussed in further detail later, the support structure opening 96 enables part of the disk drive assembly 98 to obtain leverage from the support structure 84 during installation of the disk drive assembly 98 within the main assembly 82.

The disk drive assembly 98 includes a housing 100, a disk drive 102, a daughter card 104 and a press fit lever 106. The housing 100 includes guides 108, 110 which facilitate motion of the disk drive assembly 98 within the main assembly 82. The daughter card 104 includes a connecting portion 112 having contacts which correspond to contacts within the connector 90 of the main assembly 82 such that when the disk drive assembly 98 is installed within the main assembly 82, the daughter card 104 can communicate with other devices (e.g., a computer processor) through the connector 90. The daughter card 104 operates as an interface between these other devices and the disk drive 102.

The lever 106 includes a frame portion 113 and sides 114 (left and right). The sides 114 include large finger portions 116 which define grooves 118 in combination with a lower edge portion 120 of the frame portion 113. The lever 106 further includes a cavity 124 for supporting a light emitting diode (LED) assembly (not shown) that provides operation information to the user when the disk drive assembly 22 is installed and in operation, and a latch 126 for securing the lever 106 in an upright position relative to the disk drive assembly housing 100 and the support structure 84 of the main assembly 82. Further details of how the lever 106 pivotably couples to the housing 100 about a pivot axis 128 will now be provided with reference to FIG. 4.

Figure 4:
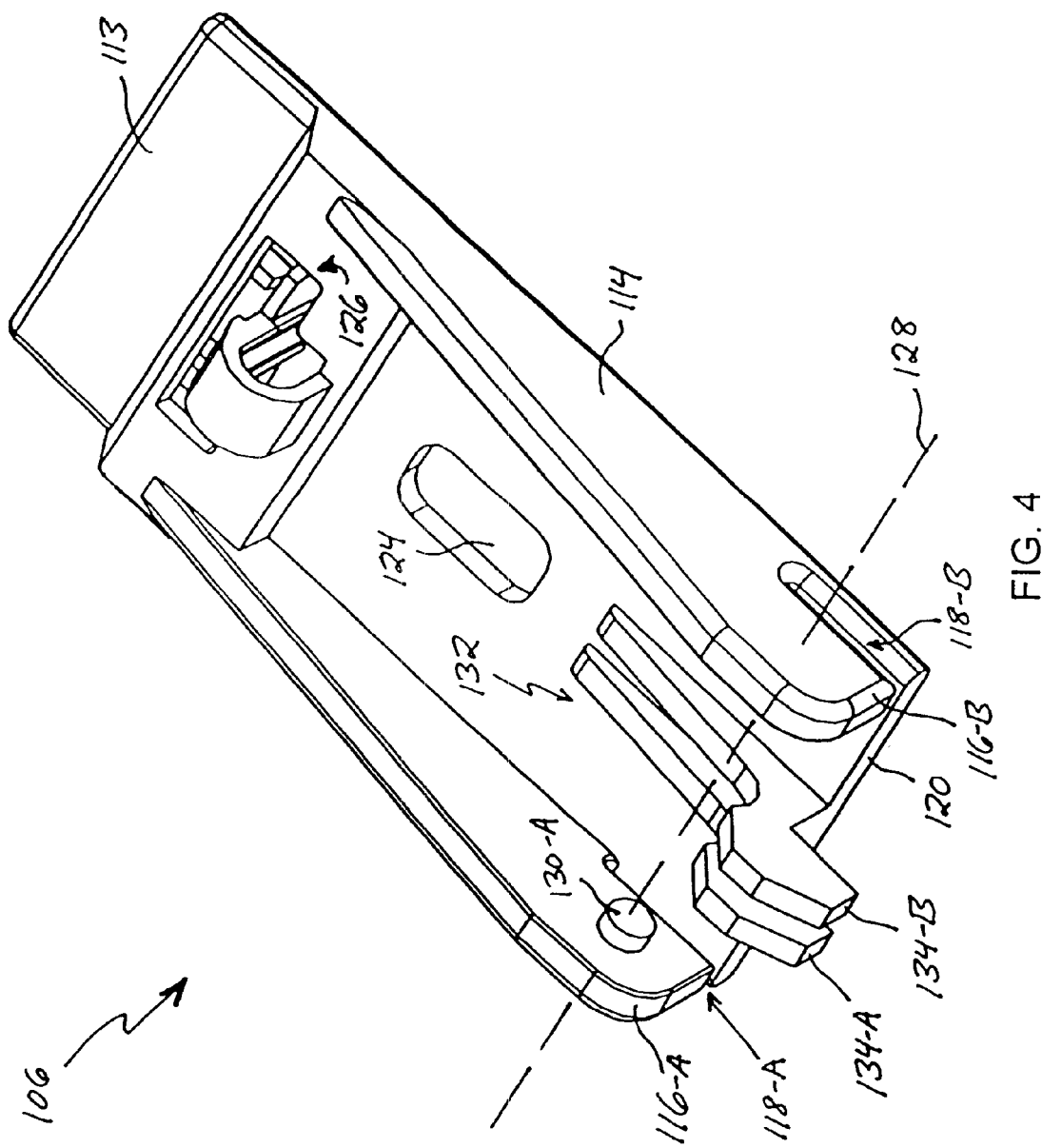
FIG. 4 is a perspective back view of the press fit lever of the disk drive assembly of FIG. 3.

FIG. 4 shows a perspective front/side view of the lever 106. The large fingers 116 (i.e., fingers 116-A and 116-B) include corresponding stubs 130 (e.g., stub 130-A on large finger 116-A). As will be discussed later, the stubs 130 align with mounting points defined by the housing 100 (see holes 170 in FIG. 8) in order to pivotably secure the lever 106 to the housing 100. The stubs 130 are contiguous with the sides 114 of the lever 106 such that the frame portion 113 and the sides 114 having the stubs 130 form a single, contiguous member of the lever 106. In one arrangement, the lever 106 is formed by injection molded plastic.

As shown in FIG. 4, the lever 106 further includes a cantilever mechanism 132 having multiple cantilever elements 134-A, 134-B (collectively, cantilever elements 134). The cantilever elements 134 extend from the lower portion 120 of the frame portion 113 such that rotation of the lever 106 during installation of the disk drive assembly 98 causes the cantilever elements 134 to engage with the main assembly 82 through the support structure opening 96 (also see FIG. 3).

It should be understood that the cantilever mechanism can alternatively have a thicker, single cantilever element 134. However, multiple cantilever elements 134 are referred due to difficulties in manufacturing a lever 106 having large, single cantilever element 134 (e.g., shrink marks on the surface of the element due to cooling difficulties, etc.).

Figure 5:
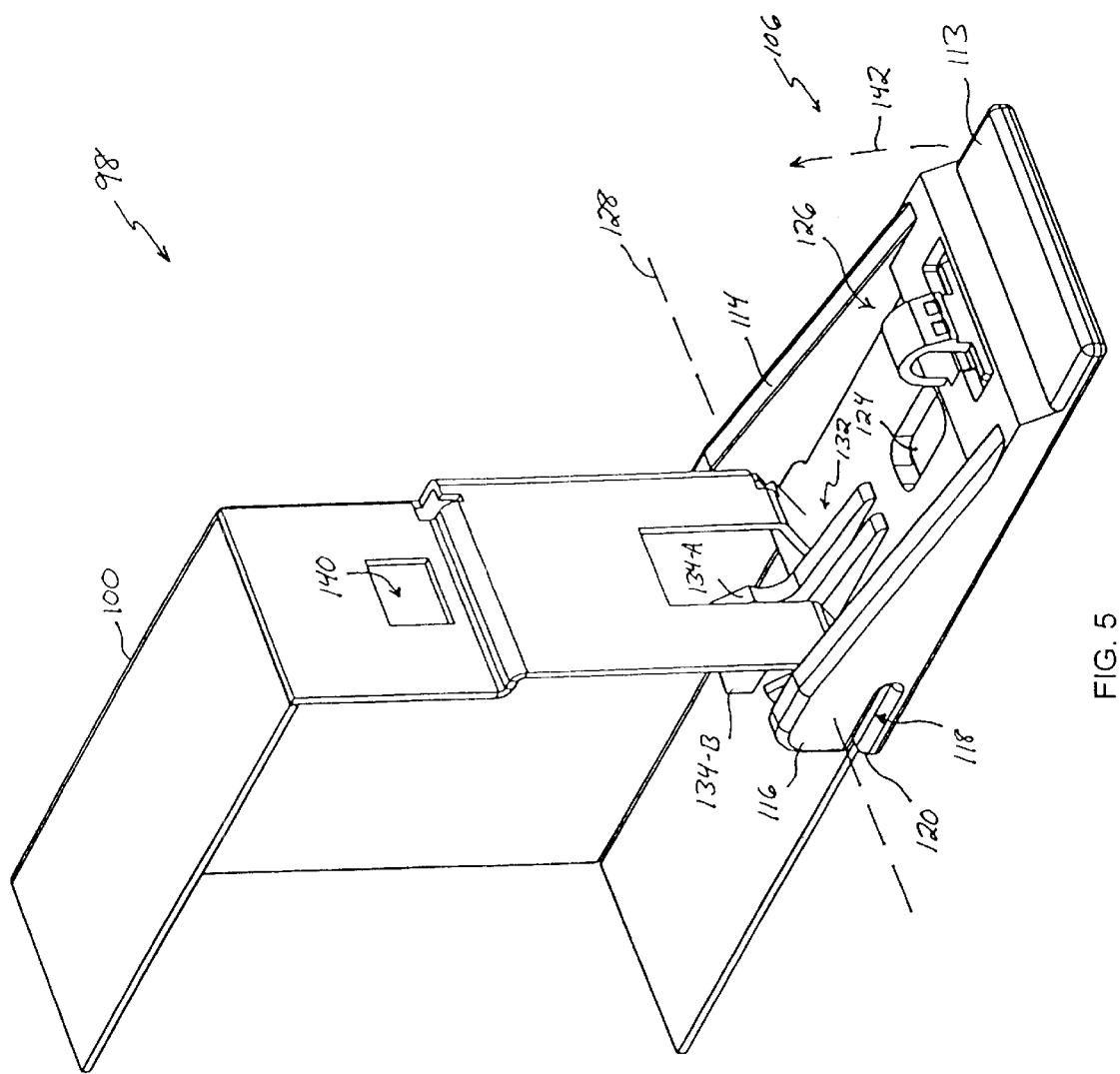
FIG. 5 shows a perspective view of a portion of the disk drive assembly of FIG. 3 when the press fit lever is unfastened from the housing.

FIG. 5 shows a perspective view of a portion of the disk drive assembly 98 with the lever 106 installed onto the disk drive housing 100. As shown in FIG. 5, the lever 106 is capable of rotating about the pivot axis 128 toward the housing 100 so that the latch 126 engages with a hole 140 defined by the housing 100 (see dashed arrow 142 indicating a direction of movement for the lever 106).

Figure 6:
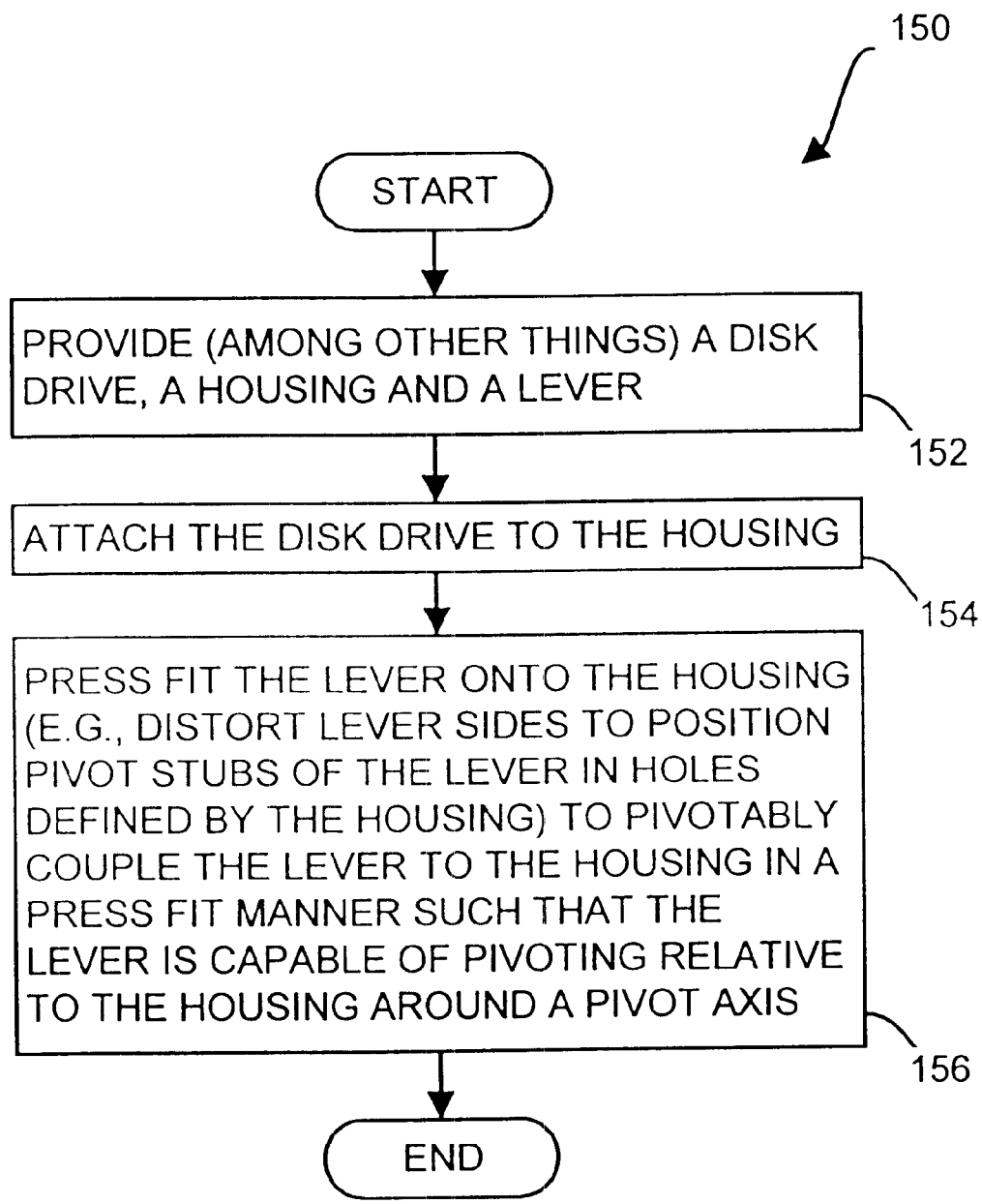
FIG. 6 is a flow diagram of a procedure for manufacturing the disk drive assembly of FIG. 3.

FIG. 6 shows a procedure 150 performed by a disk drive manufacturer when manufacturing the disk drive assembly 98 of FIG. 3. In step 152, the manufacturer provides, among other things, the disk drive 102, the housing 100 and the press fit lever 106.

In step 154, the manufacturer attaches the disk drive 102 to the housing 100. At this point, the manufacturer can attach other components to the housing 100 as well (e.g., the daughter card 104).

In step 156, the manufacturer press fits the lever 106 onto the housing 100 so that the lever 106 is pivotably coupled to the housing 100. In one arrangement, sides 114 of the lever 106 are capable of bending, and the manufacturer distorts the sides 114 of the lever 106 such that stubs 130 on the sides 114 (see FIG. 4) expand around the housing 100 and flex back to the original shape to align into holes 170 defined by the housing 100 (see FIG. 8). The lever 106 is now pivotably secured to the housing 100 in a press fit manner, and capable of rotating or pivoting about the pivot axis 128.

It should be understood that there is no requirement that step 154 come before step 156. Rather, the order of steps 154 and 156 can be reversed in procedure 150.

Additionally, it should be understood that the use of complex, automated machinery is unnecessary when performing step 156. Rather, a person can simply snap the press fit lever 106 into the holes 170 of the housing 100 manually (see FIG. 8). The holes 170 defined by the housing 100 can be simple, non-threaded holes (e.g., punched or cut into the sheet metal housing 100). Accordingly, the invention provides a low cost, quick-to-assemble, ergonomically improved technique for manufacturing the disk drive assembly 98. Further details of how the disk drive assembly 98 installs into the main assembly 82 will now be provided with reference to FIGS. 7 through 9.

Figure 7:
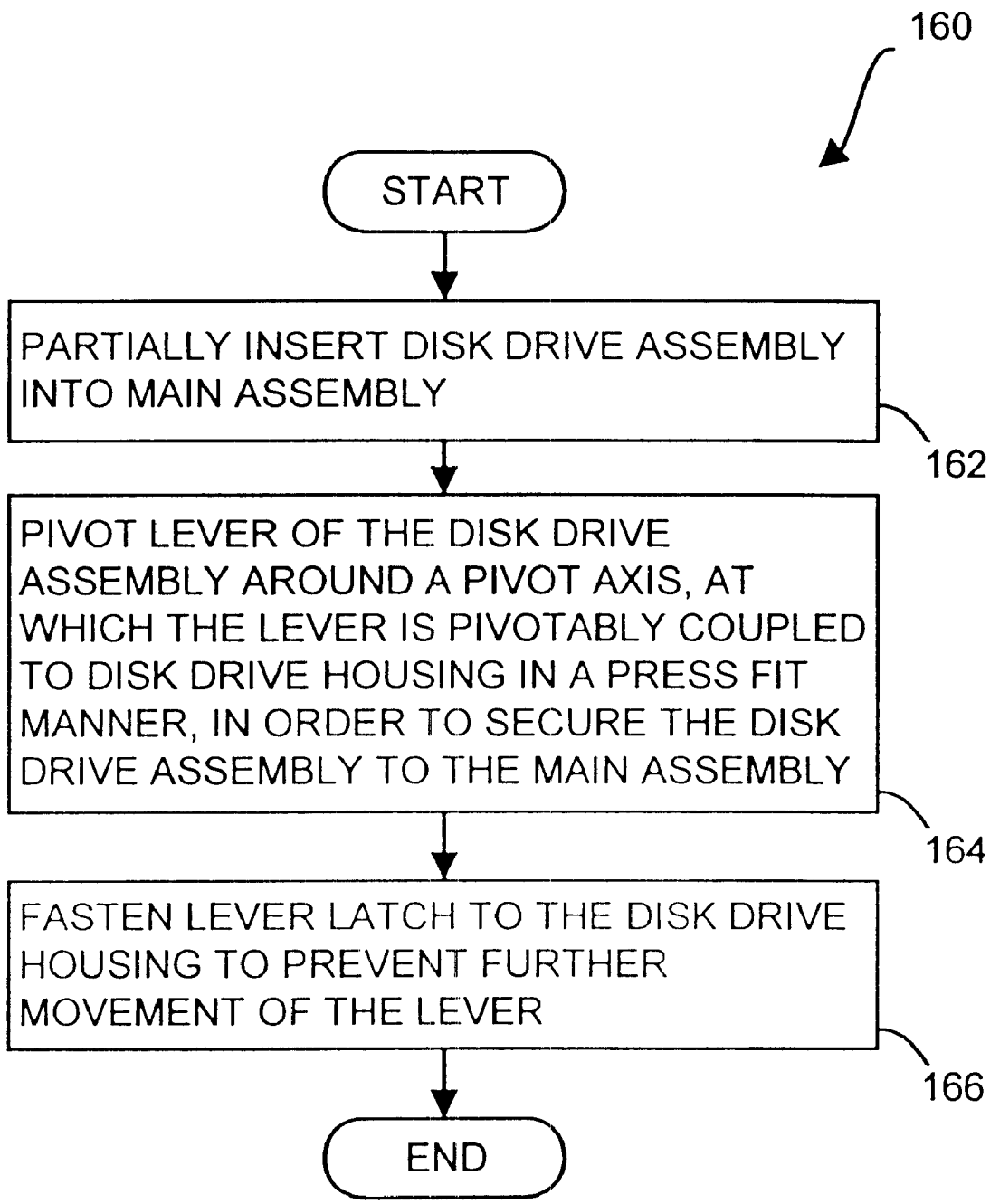
FIG. 7 is a flow diagram of a procedure for installing the disk drive assembly of FIG. 3 into the main assembly.

FIG. 7 shows a procedure 160 performed by a user (e.g., a systems administrator, technician, etc.) when installing the disk drive assembly 98 into the main assembly 82. In step 162, the user partially inserts the disk drive assembly 98 into the main assembly 82 until the ends of the post 94 partially engage the grooves 118 of the lever 106 (also see FIGS. 5 and 3). In one arrangement, the user simply slides the disk drive assembly 98 partially through the opening 86 defined by the support structure 84 of the main assembly 82. The guides 108, 110 facilitate movement of the disk drive assembly 98 into the main assembly 82 by reducing friction and restricting directions of movement of the disk drive assembly 98 within the main assembly 82.

Figure 8:
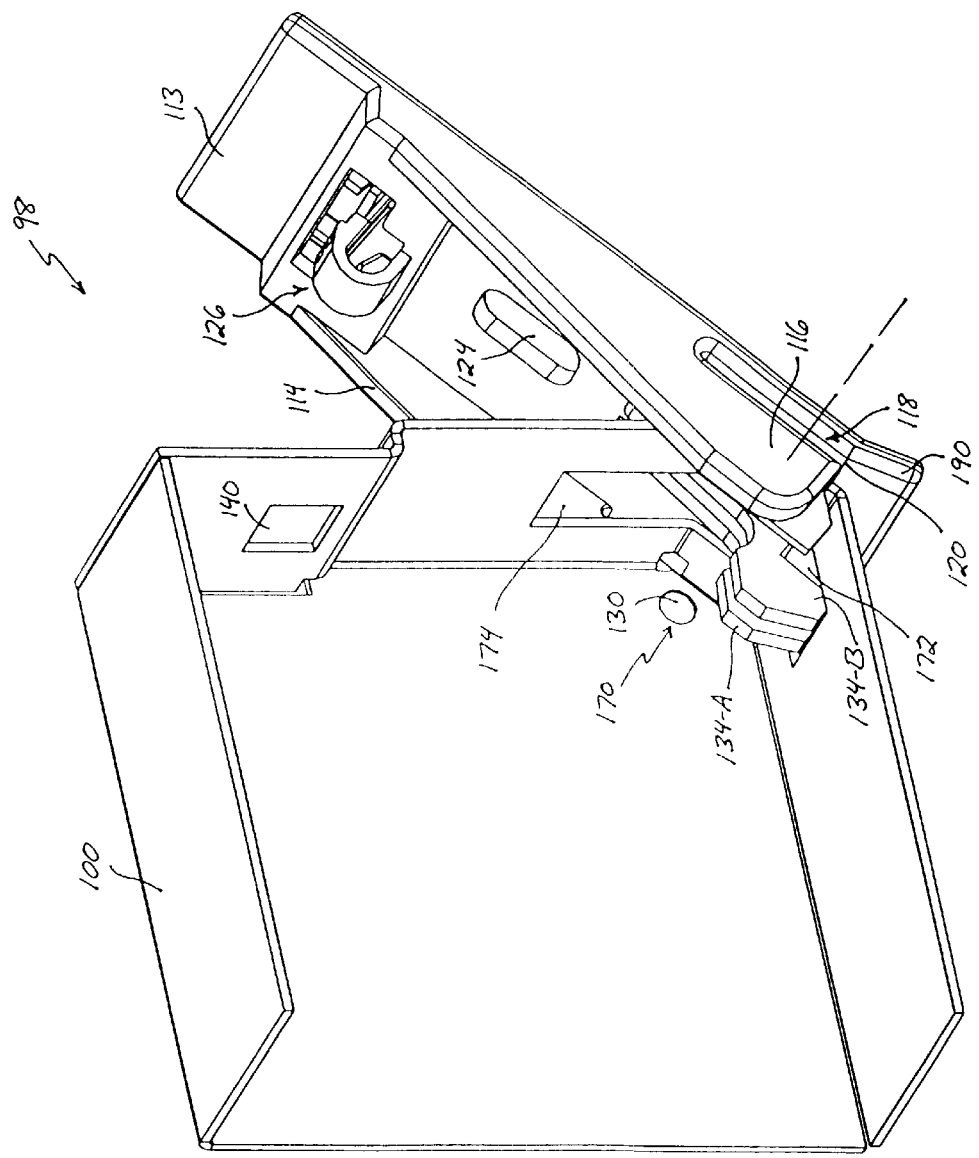
FIG. 8 shows another perspective view of the portion of the disk drive assembly of FIG. 5 when the press fit lever is unfastened from the housing.

In step 164 and as shown in FIG. 8, the user pivots the lever 106 around the pivot axis 128 at which the lever 106 is pivotably coupled to the housing 100 in a press fit manner. In this step, the edges of the grooves 118 grab the post 94 and the cantilever elements 134 press against the edge of the opening 96 defined by the support structure 96 (as the cantilever elements 134 pass through the opening 96) to provide leverage which moves the disk drive assembly 98 further into the main assembly 82 in a controlled and consistent manner. The cantilever action provided by the cantilever elements 134 and the edges of the grooves 118 prevents stress on the sides 114 of the lever 106 that otherwise might damage the lever 106 (e.g., permanently distort the lever 106) or cause the lever 106 to disengage from the holes 170 of the housing 100 (e.g., cause the lever 106 to pop off the housing 100). During step 164, the connecting portion 112 of the daughter card 104 mates with the slot 92 of the connector 90 of the main assembly 82.

Figure 9:
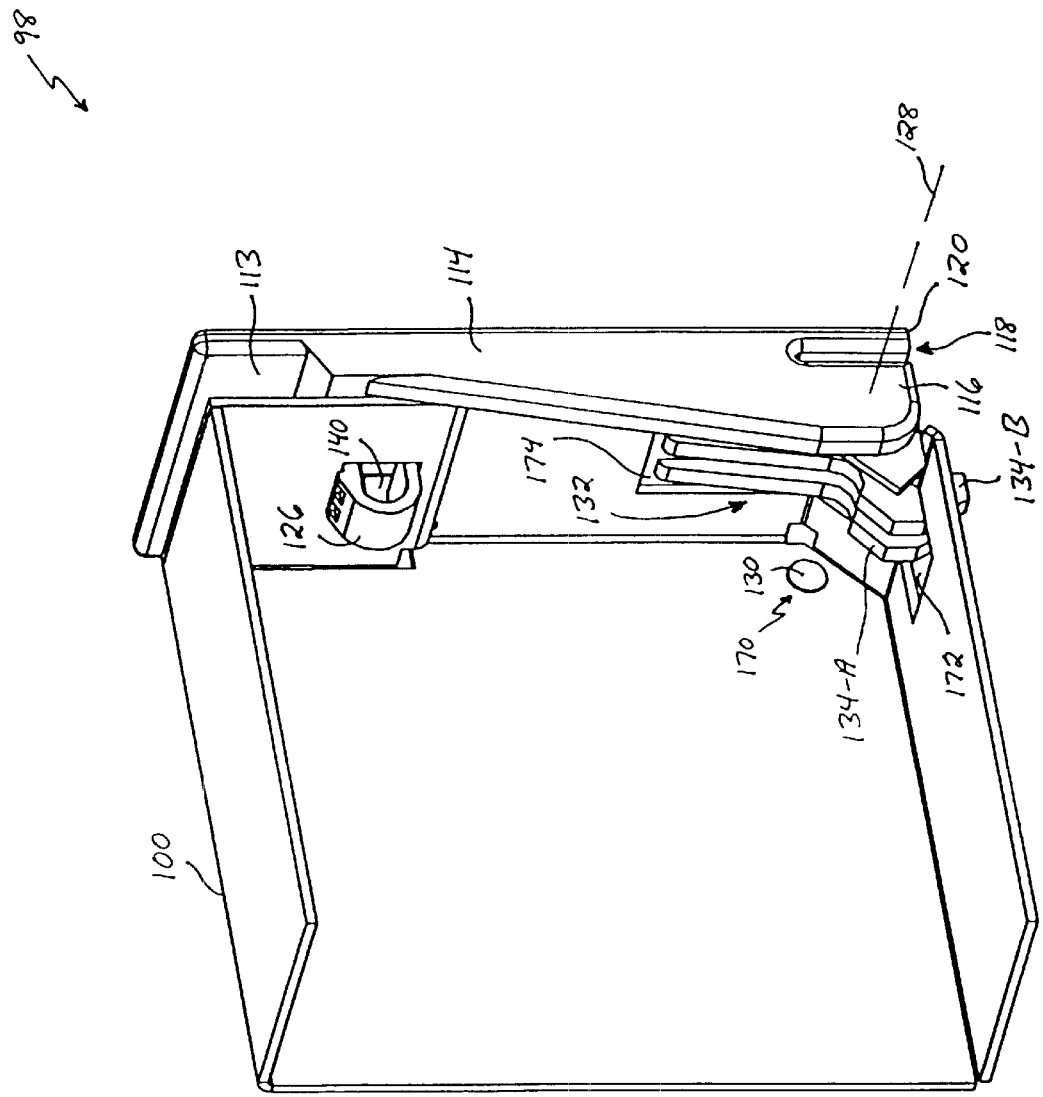
FIG. 9 shows a perspective view of the portion of the disk drive assembly of FIG. 8 when the press fit lever is fastened to the housing.

In step 166 and as shown in FIG. 9, the user fastens the latch 126 of the lever 106 n the upright position against the disk drive housing 100 (i.e., the latch 126 latches through the hole 140 of the housing 100) to prevent further movement of the lever 106. Accordingly, the disk drive assembly 98 is secured within the main assembly 98 and the installation procedure 160 is complete.

When the disk drive assembly 98 is properly installed within the main assembly 82, contacts along the connecting portion 112 of the daughter card 104 make electrical contact with corresponding contacts within the connector 90. In this mated position, the disk drive assembly 98 is capable of receiving power and communicating with other devices (e.g., a computer processor) through the connector 90 in order to perform data storage and retrieval operations. The daughter card 104 operates as an interface between the other devices and the disk drive 102. Further details of how the disk drive assembly 98 removes from the main assembly 82 will now be provided with reference to FIG. 10.

Figure 10:
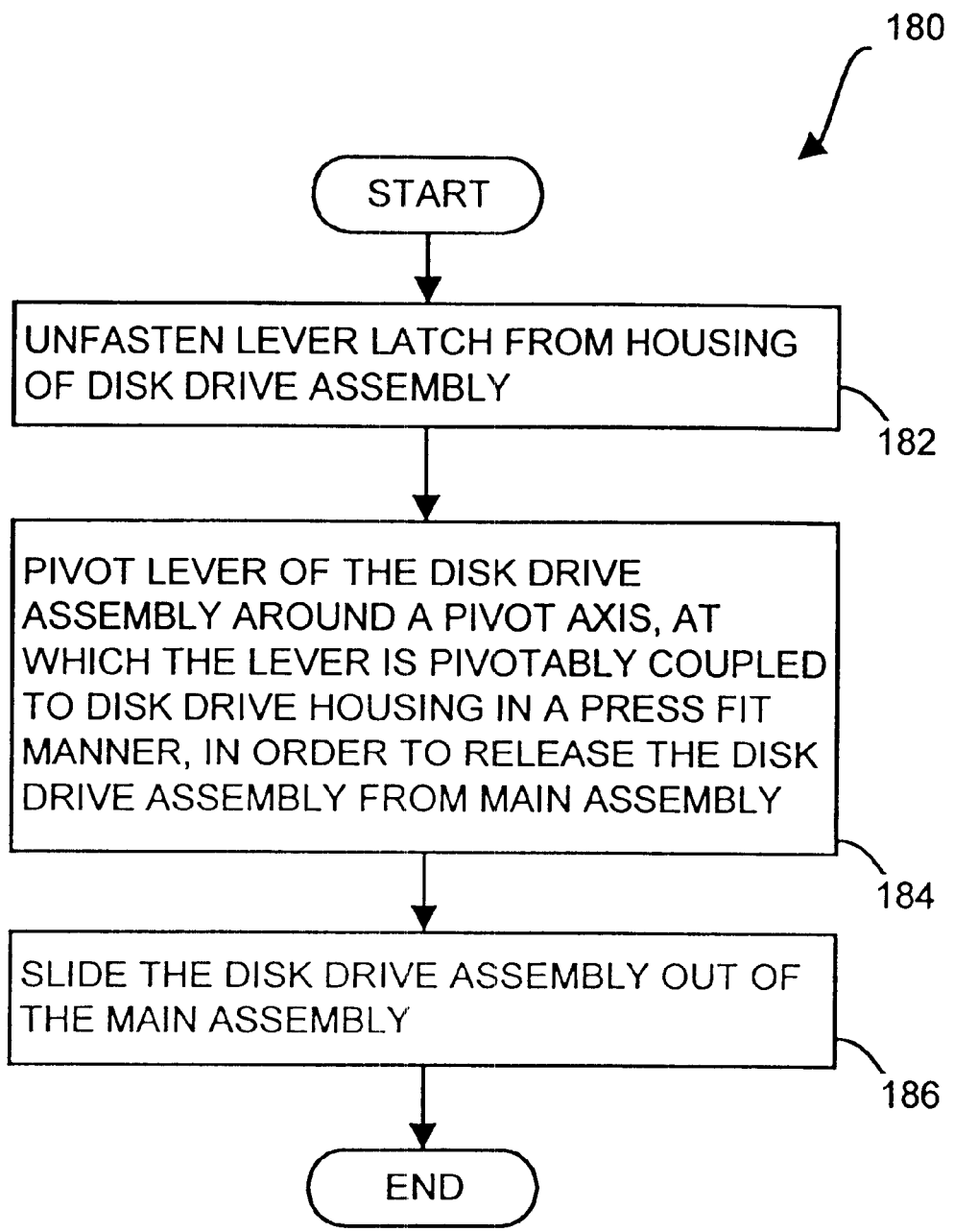
FIG. 10 is a flow diagram of a procedure for removing the disk drive assembly of FIG. 3 from the main assembly.

FIG. 10 shows a procedure 180 performed by the user when removing the disk drive assembly 98 from the main assembly 82. In step 182, the user unfastens the latch 126 from the disk drive housing 100 of the disk drive assembly 98. Accordingly, the lever 106 is now capably of rotating from the upright position (FIG. 9) away the housing 100 (FIG. 8).

In step 184, the user pivots the lever 106 around the pivot axis 128 at which the lever 106 is pivotably coupled to the housing 100. Here, as the lever 106 rotates around the pivot axis 128, the lower edge portion 120 of the frame portion 113 pushes against the main assembly 82 to move the disk drive assembly 98 away from the back end 88 of the support structure 84 (see FIG. 3). In one arrangement (and as will be discussed later), the lever 106 optionally includes an ancillary portion 190 (FIG. 8) that provides a surface (in place of the lower edge portion 120) that contacts and pushes against the main assembly support structure 84 thus enabling the lever 106 to obtain additional leverage. During such movement, the connecting portion 112 of the daughter card 112 un-mates with the connector 90 of the main assembly 82 allowing the disk drive assembly 98 to freely slide within the main assembly 82.

In step 186, the user slides the disk drive assembly 98 out of the main assembly 82 to complete the removal procedure 180.

It should be understood that lever 106 is somewhat flexible in order to enable the lever 106 to press fit onto the disk drive housing 100. However, it also should be understood that the lever 106 is fairly rigid in order to minimize distortion or deformation of the lever 106 when the user operates the lever 106 during the installation and removal procedures 160, 180. The cantilever elements 134 provide additional leverage during installation, and the lower edge portion 120 provides additional leverage during removal such that stresses on the lever sides 114 (and stubs 130) are kept low. Accordingly, any distortion of the sides 114 (or the stubs 130) during normal installation or removal is not severe enough to damage the lever 106 (e.g., permanently distort the lever 106) or to cause the lever to deform to the point of detaching from the housing 100. Proper removal of the lever 106 from the housing 100 typically requires the user to apply outward force to the lever sides 114 (e.g., using a special tool) to pry the sides 114 away from the housing 100 so that the stubs 130 disengage from the holes 170 of the housing 100.

As described above, the techniques of the invention use a press fit lever for a disk drive assembly. Use of such a lever alleviates the need for separate hardware (e.g., screws and inserts) which are used with conventional disk drive assembly levers. Accordingly, the techniques of the invention are well-suited to reducing complexity, and lowering costs and time associated with installing such levers on disk drive assemblies. The features of the invention may be particularly useful when applied to devices manufactured by EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the post 94 is not essential to the main assembly 94. Rather, the support structure 84 can extend to provide a surface for engaging the grooves 118 of the lever 106. In one arrangement, the support structure 84 simply provides two tabs (e.g., curve metallic tabs for strength) that engage the grooves 118. In another arrangement, the bottom of the support structure 84 (i) is wide enough to define one or more openings that receive the large fingers 116 and (ii) is configured to provide one or more edges (along the openings) that engage the grooves 118.

Additionally, it should be understood that the support structure 84 and the disk drive housing 100 were described as metallic housings by way of example only. Other materials are suitable for the support structure 84 and the housing 100 such as fiberglass, plastic, etc. Moreover, each of the support structure 84 and the housing 100 can take several forms such as a cage, a rack, a platform, etc.

Furthermore, it should be understood that the pivot axis 128 is shown as being horizontally-oriented and located at the bottom of the disk drive assembly 98 by way of example only. In alternative arrangements, the pivot axis 128 is disposed in different locations such as vertically on a lateral side of the housing 100, and horizontally on the top edge of the housing 100.

Additionally, it should be understood that the lever 106 can be made of a variety of materials. In one arrangement, the lever 106 is molded out of plastic. In other arrangements, the lever 106 is formed from different materials and/or multiple materials such as fiberglass, rubber coated metal, etc.

Moreover, it should be understood that the lever 106 is shown as having a rectangular shape by way of example only. Other shapes and configurations are suitable for the lever 106 as well. For example, the frame portion 113 of the lever 106 can be extended from that shown in FIGS. 3–5 to that shown in FIG. 8, which includes an ancillary portion 190. The ancillary portion 190 provides a surface (rather than the lower edge portion 120) that contacts the main assembly support structure 84 from which the lever 106 can push off of in order to obtain leverage when the lever 106 rotates away from the disk drive housing 100 to remove the disk drive assembly 98 from the main assembly 82 (i.e., from which the lever 106 can eject off of when removing the disk drive assembly 98 from the main assembly 82). In one arrangement, the ancillary portion 190 and the frame portion 113 form a single, contiguous member having a flexible joint therebetween thus enabling the ancillary portion 190 to bend relative to the frame portion 113.

Figure 1:
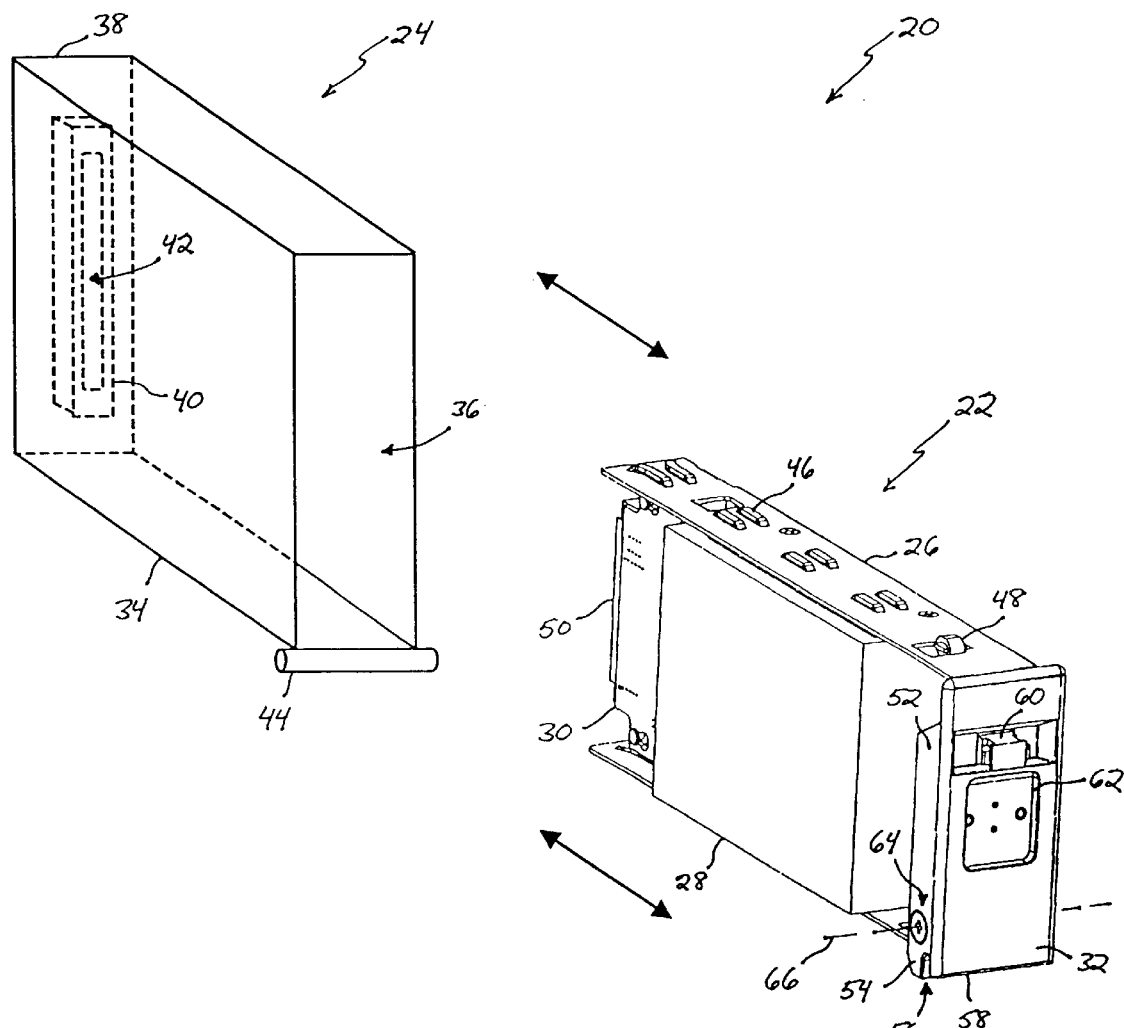
FIG. 1 shows a perspective view of a conventional data storage system that includes a main assembly and a disk drive assembly having a lever which is secured to a housing of the disk drive assembly by separate hardware.
Figure 2:
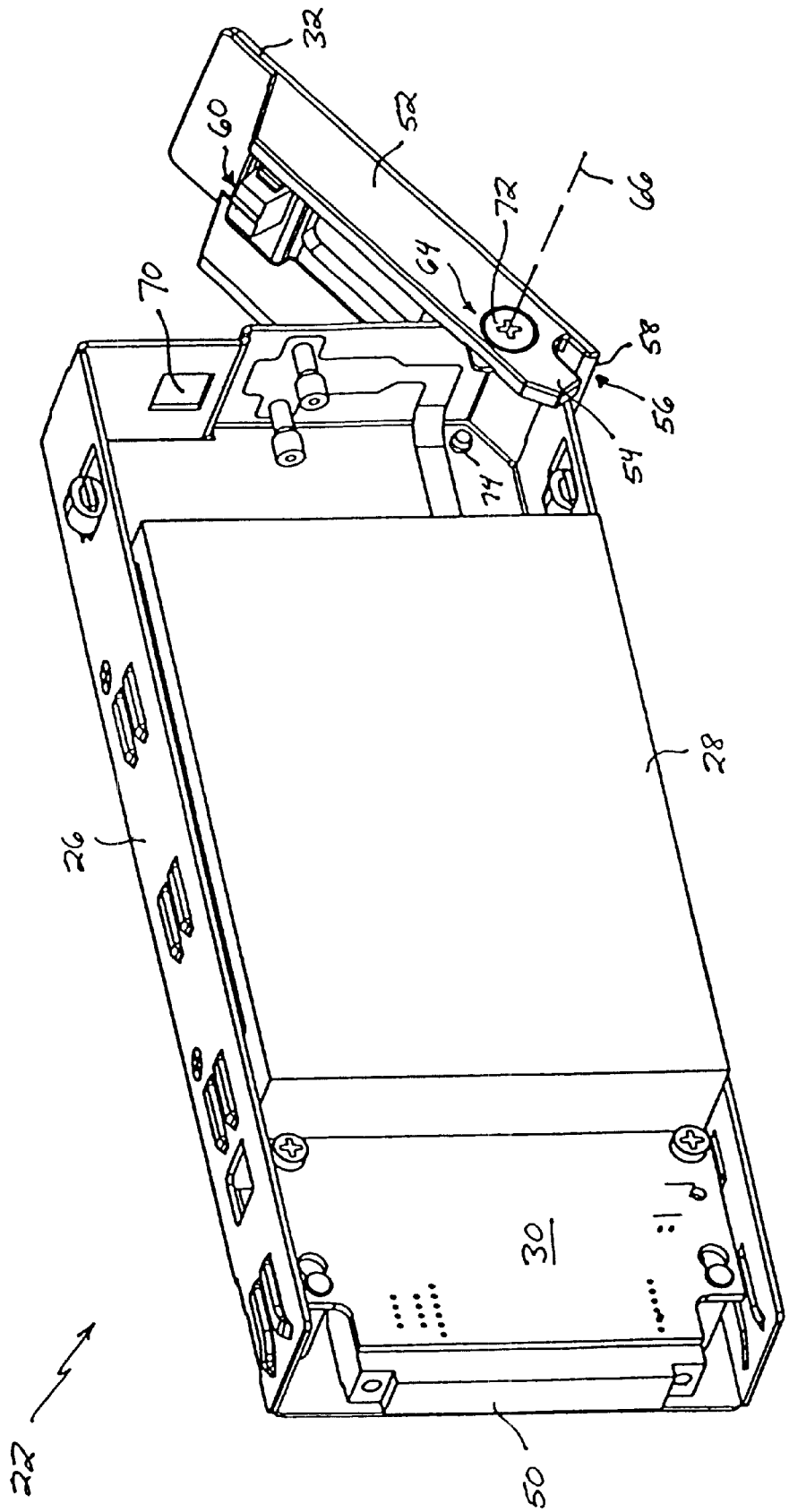
FIG. 2 shows a perspective view of the conventional disk drive assembly of FIG. 1 when the lever is unfastened from the housing.

Furthermore, the latch 126 of the lever 106 is shown as a pull-down latching mechanism which is a simpler release mechanism and is typically more ergonomically pleasing to the user than the pinch-type latching mechanism shown in conventional approaches (e.g., see FIG. 1). Nevertheless, the lever 106 can use the pinch-type latch mechanism, or other latching mechanisms as well, in place of the pull-down latching mechanism.

What is claimed is:

1. A disk drive assembly, comprising:

a housing;

a disk drive attached to the housing; and a lever that secures the housing to and releases the housing from a main assembly, the lever including:
a frame portion, and
side portions that extend from the frame portion, the side portions pivotably coupling the lever to the housing in a press fit manner such that the frame portion is capable of pivoting relative to the housing and the main assembly in order to secure the housing to and release the housing from the main assembly;
wherein the side portions of the lever include stubs, wherein the lever further includes a cantilever mechanism that extends from the frame portion; and wherein the frame portion, the side portions including the stubs, and the cantilever mechanism form a single, contiguous member of the lever.

2. The disk drive assembly of claim 1 wherein the housing defines cavities, and wherein the stubs of the side portions of the lever insert into the cavities defined by the housing in order to pivotably couple the lever to the housing.

3. The disk drive assembly of claim 1 wherein the cantilever mechanism includes multiple cantilever elements, each cantilever element extending from the frame portion.

4. The disk drive assembly of claim 1 wherein the housing defines holes, and wherein the stubs are configured to move toward each other and insert into the holes defined by the housing in order to pivotably couple the lever to the housing in the press fit manner.

5. The disk drive assembly of claim 4 wherein the frame portion and the side portions of the lever are integrated into a unitary member with the frame portion and the side portions of the lever being unable to substantially move relative to each other.

6. A disk drive assembly, comprising:

a housing;

a disk drive attached to the housing; and a lever that secures the housing to and releases the housing from a main assembly, the lever including:
a frame portion, and
side portions that extend from the frame portion, the side portions pivotably coupling the lever to the housing in a press fit manner such that the frame portion is capable of pivoting relative to the housing and the main assembly in order to secure the housing to and release the housing from the main assembly;
wherein the housing defines cavities; wherein the side portions of the lever include stubs that insert into the cavities defined by the housing in order to pivotably couple the lever to the housing; and wherein each side portion includes a finger that defines, with the frame portion, a groove that engages with the main assembly; and wherein each finger has one of the stubs that insert into the cavities defined by the housing.

7. A disk drive assembly, comprising:

a housing;

a disk drive attached to the housing; and a lever that secures the housing to and releases the housing from a main assembly, the lever including:
a frame portion, and
side portions that extend from the frame portion, the side portions pivotably coupling the lever to the housing in a press fit manner such that the frame portion is capable of pivoting relative to the housing and the main assembly in order to secure the housing to and release the housing from the main assembly;
wherein the housing defines cavities; wherein the side portions of the lever include stubs that insert into the cavities defined by the housing in order to pivotably couple the lever to the housing; and wherein the frame portion and the side portions including the stubs form a single, contiguous member of the lever.

8. A method for installing a disk drive assembly in a main assembly, the disk drive assembly including a housing and a lever, the method comprising the steps of:

partially inserting the disk drive assembly into the main assembly; and pivoting the lever of the disk drive assembly around a pivot axis, at which the lever is pivotably coupled to the housing in a press fit manner, in order to secure the disk drive assembly to the main assembly; wherein the lever includes a frame portion and side portions; wherein the side portions define grooves with the frame portion; and wherein the step of pivoting includes the step of:

moving the lever such that the grooves engage with portions of the main assembly when securing the disk drive assembly to the main assembly.

9. The method of claim 8 wherein the housing defines holes, wherein the lever defines stubs, and wherein the method further includes the step of:

moving the stubs of the lever toward each other and inserting the stubs into the holes defined by the housing in order to pivotably couple the lever to the housing in the press fit manner.

10. A method for removing a disk drive assembly from a main assembly, the disk drive assembly including a housing and a lever, the method comprising the steps of:

pivoting the lever of the disk drive assembly around a pivot axis, at which the lever is pivotably coupled to the housing in a press fit manner, in order to release the disk drive assembly from the main assembly; and sliding the disk drive assembly out of the main assembly; wherein the lever includes a frame portion and side portions; wherein the side portions define grooves with the frame portion; and wherein the step of pivoting includes the step of:

moving the lever such that the grooves engage with portions of the main assembly when securing the disk drive assembly to the main assembly.

11. The method of claim 10 wherein the housing defines holes, wherein the lever defines stubs, and wherein the method further includes the step of:

moving the stubs of the lever toward each other and inserting the stubs into the holes defined by the housing in order to pivotably couple the lever to the housing in the press fit manner.

12. A lever for installing a disk drive assembly into and removing the disk drive assembly from a main assembly, the lever comprising:

a frame portion;

side portions, extending from the frame portion, that pivotably couple the lever to a housing in a press fit manner such that the frame portion is capable of pivoting relative to the housing and the main assembly in order to secure the housing to and release the housing from the main assembly; and a cantilever mechanism that extends from the frame portion, wherein the side portions of the lever include stubs, wherein the frame portion, the side portions including the stubs, and the cantilever mechanism form a single, contiguous member of the lever.

13. The lever of claim 12 wherein the cantilever mechanism includes multiple cantilever elements, each cantilever element extending from the frame portion.

14. The lever of claim 12 wherein the stubs are configured to move toward each other and insert into holes defined by the housing in order to pivotably couple the lever to the housing in the press fit manner.

15. The lever of claim 14 wherein the frame portion and the side portions are integrated into a unitary member with the frame portion and the side portions of the lever being unable to substantially move relative to each other.

16. A lever for installing a disk drive assembly into and removing the disk drive assembly from a main assembly, the lever comprising:

a frame portion; and side portions, extending from the frame portion, that pivotably couple the lever to a housing in a press fit manner such that the frame portion is capable of pivoting relative to the housing and the main assembly in order to secure the housing to and release the housing from the main assembly; wherein the housing defines cavities, and wherein the side portions of the lever include stubs that insert into the cavities defined by the housing in order to pivotably couple the lever to the housing.

17. The lever of claim 16 wherein each side portion includes a finger that defines, with the frame portion, a groove that engages with the main assembly; and wherein each finger has one of the stubs that insert into the cavities defined by the housing.

18. The lever of claim 16 wherein the frame portion and the side portions including the stubs form a single, contiguous member of the lever.

19. A data storage system, comprising:

a main assembly having a supporting structure and a connector fastened to the supporting structure; and a disk drive assembly having a housing, a disk drive attached to the housing, and a lever that installs the housing into and removes the housing from the main assembly to enable the disk drive to respectively connect to and disconnect from the connector of the main assembly, the lever including:

a frame portion, and side portions that extend from the frame portion, the side portions pivotably coupling the lever to the housing in a press fit manner such that the frame portion is capable of pivoting relative to the housing and the main assembly in order to secure the housing to and release the housing from the main assembly, wherein the housing defines cavities, and wherein the side portions of the lever include stubs that insert into the cavities defined by the housing in order to pivotably couple the lever to the housing.

* * * * *